United States Patent [19]

McMillan, II et al.

[11] Patent Number: 5,663,529
[45] Date of Patent: Sep. 2, 1997

[54] ANTI-SKEW MOUNTING PADS AND PROCESSING METHOD FOR ELECTRONIC SURFACE MOUNT COMPONENTS

[75] Inventors: Richard Keith McMillan, II, Dearborn; Vivek Amir Jairazbhoy, Farmington Hills, both of Mich.

[73] Assignee: Ford Motor Company, Dearborn, Mich.

[21] Appl. No.: 528,369

[22] Filed: Sep. 14, 1995

[51] Int. Cl.$^6$ .................................................. H05K 1/02
[52] U.S. Cl. .......................... 174/252; 174/260; 29/832; 29/834; 29/840; 361/767
[58] Field of Search ............................ 174/260, 261, 174/252; 29/832, 834, 840; 361/760, 767, 768, 777; 439/83, 71, 68

[56] References Cited

U.S. PATENT DOCUMENTS

| | | | |
|---|---|---|---|
| 3,842,190 | 10/1974 | Towell | 174/68.5 |
| 3,964,087 | 6/1976 | Mallon | 338/306 |
| 4,883,920 | 11/1989 | Tanabe et al. | 174/68.5 |
| 5,266,747 | 11/1993 | Gheorghiu et al. | 174/254 |
| 5,303,122 | 4/1994 | Adams, Jr. et al. | 361/767 |
| 5,311,405 | 5/1994 | Tribbey et al. | 361/767 |
| 5,357,060 | 10/1994 | Yamashita | 174/267 |
| 5,362,927 | 11/1994 | Ezaki | 174/261 |
| 5,453,528 | 9/1995 | Amano et al. | 174/261 |

OTHER PUBLICATIONS

"Surface Mount Footprint Improvement", IBM Technical Disclosure Bulletin, vol. 31, No. 3, Aug. 1988, p. 408.

*Primary Examiner*—Laura Thomas
*Attorney, Agent, or Firm*—Richard D. Dixon

[57] ABSTRACT

A footprint, and method for forming the footprint, of the type for mounting a surface mount component having a heatsink which defines a first registration edge thereon. The substrate pad is positioned on the substrate for registrated engagement with the heatsink. The substrate pad has an area substantially larger than the area of the heatsink to improve the dissipation of thermal energy. The substrate pad includes notches for defining registration edges which are juxtaposed with corresponding registration edges on the heatsink when the electronic component is in proper alignment with the substrate pad. Surface tension forces produced by melting solder interposed between the heatsink and the substrate pad act upon the registration edges to maintain proper alignment of the component with the substrate pad.

23 Claims, 4 Drawing Sheets

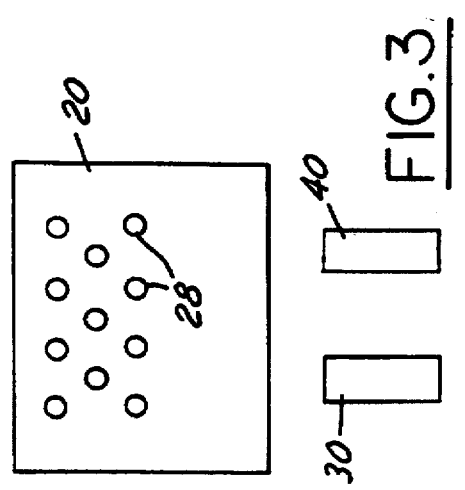
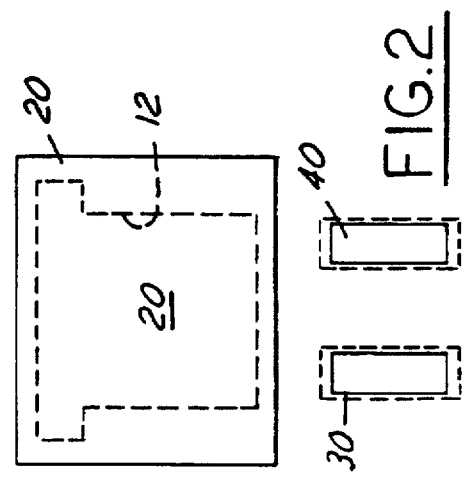
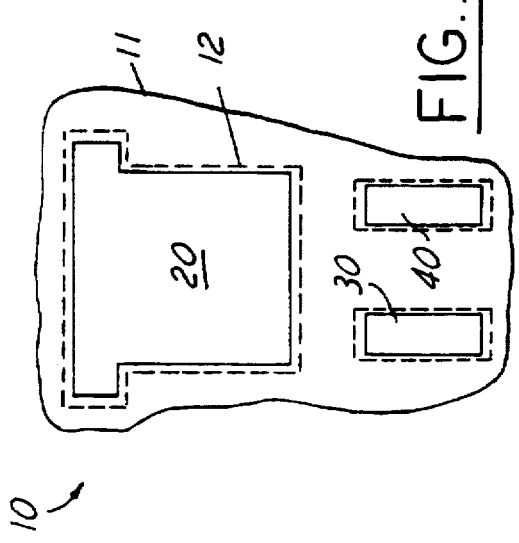
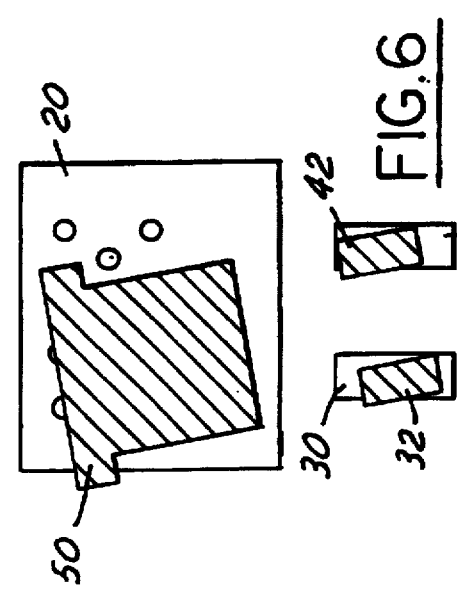
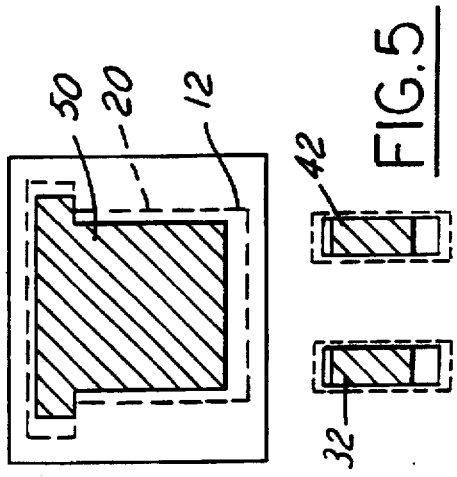
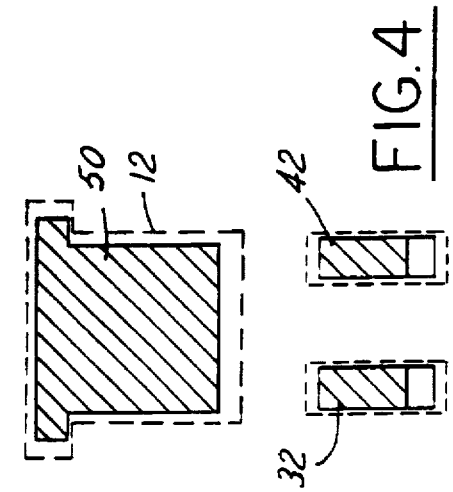

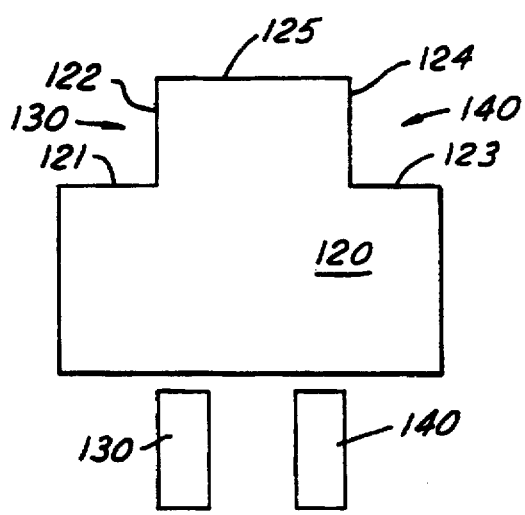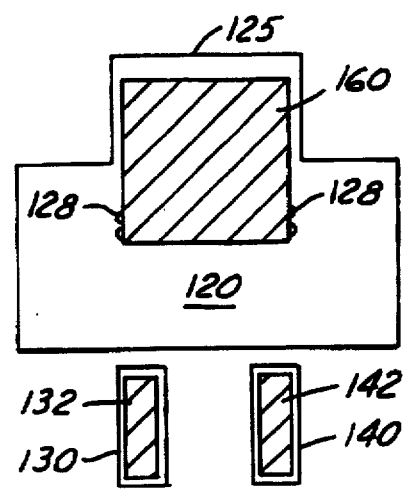
FIG.7  FIG.8
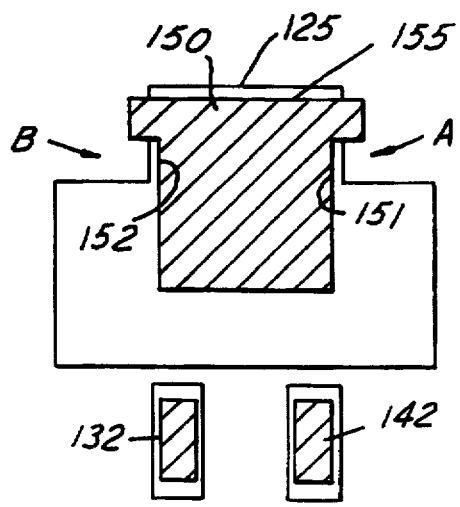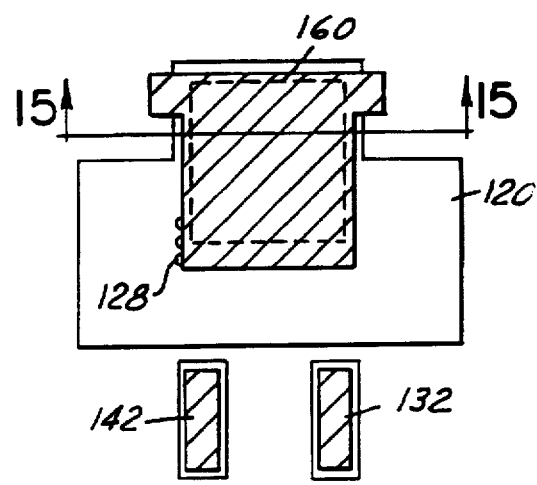
FIG.9  FIG.10

/ 1
ANTI-SKEW MOUNTING PADS AND PROCESSING METHOD FOR ELECTRONIC SURFACE MOUNT COMPONENTS

FIELD OF THE INVENTION

This invention relates to a method and apparatus for mounting electronic components to a substrate, and more specifically to a method and apparatus for aligning and attaching power surface mount electronic components to substrate mounting pads of the type used on a printed circuit board.

BACKGROUND OF THE INVENTION

As printed circuit board and surface mount component geometries become smaller, it becomes even more important to maintain, throughout the manufacturing and especially the component attachment process, the precise alignment between the conductors on the surface mount device and the printed wiring board contact pads. Any undesired component displacements, especially skew, can cause product defects such as electrical open and short circuits. These defects necessitate increased spacing between components, increased product size, weight and cost.

Even under optimal process conditions, a surface mount component can be displaced from the desired location due to the forces acting on the component during the reflow soldering operation. For surface mount power devices incorporating a solderable heatsink, this skewing problem is more pronounced because of the large size of device and consequently large clearance areas require to accommodate even relatively small degrees of skew and because of their increased propensity to skew when large mounting pads are required to provide adequate heat transfer in the device.

One solution for the mounting of non-power surface mount devices on printed circuits is disclosed by Tribbey et al in U.S. Pat. No. 5,311,405. Tribbey teaches the use of a pair of tri-oval shaped areas in which solder paste is applied only to the elliptical areas within the tri-oval. When the surface mount device is placed thereupon, and the entire assembly is reflow soldered, the melting solder within the solder paste facilitates the alignment of the surface mount component with the pads. While this approach may be suitable for small devices, it is not well suited for power devices which have more than two leads and/or a very large heat dissipation pad.

In applications requiring high reliability for the mounting of power surface mount electronic components onto printed circuit boards, new solutions for these problems must be found. These problems are made even more difficult when the solution must be adaptable to high volume production techniques where product fallout and rework must be held to an absolute minimum.

SUMMARY OF THE INVENTION

According to the present invention, a footprint is provided for mounting a standardized surface mount component of the type having a heatsink of known area and a periphery including a first registration edge. The footprint comprises a pad formed on a substrate and positioned for aligned engagement with the heatsink of the electronic component. The substrate pad has an area substantially larger than the area of the heatsink. The substrate pad includes a first notch defining therein a first registration edge for being juxtaposed with a corresponding first registration edge on the periphery of the heatsink when the electronic component is in proper alignment on the substrate pad. Surface tension forces produced by melting a solder paste interposed between the heatsink and the substrate pad acts upon the juxtaposed first registration edges to maintain proper alignment of the component heatsink with the substrate pad.

BRIEF DESCRIPTION OF THE DRAWINGS

Other objects, features and advantages of the present invention will become apparent from a study of the written description and the drawings in which:

FIGS. 1, 2 and 3 are top plan views of a prior art printed circuit board having a heatsink and solder resist material deposited thereon.

FIGS. 4, 5 and 6 are respectively paired with FIGS. 1, 2 and 3 to show the heatsink footprint of the prior art surface mount device, with FIG. 6 showing a skewed or improperly aligned prior art SMD device.

FIG. 7 is a top plan view of an SMD mounting pads in accordance with the present invention.

FIG. 8 illustrates the application of solder paste on the mounting pads of FIG. 9.

FIG. 9 illustrates the footprints of component heatsink and lead solderable areas on the mounting pads.

FIG. 10 illustrates the component heatsink alignment that will be held in place by the surface tension of the solder in accordance with the present invention.

PROCESS DESCRIPTION

Figure 11:
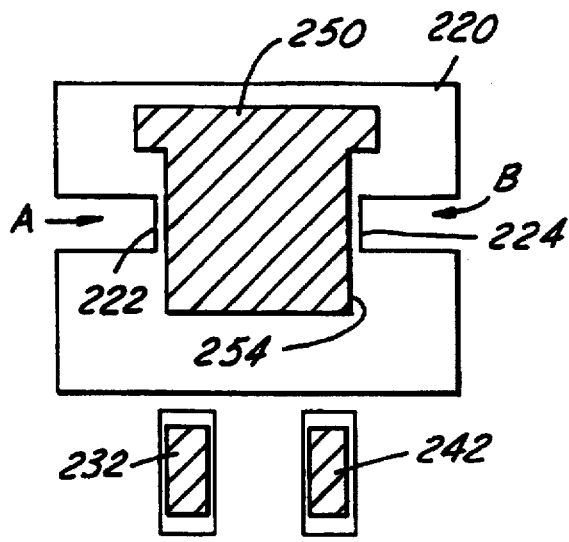
FIGS. 11 and 12 illustrate a first alternate embodiment of the mounting pad and surface mount processes in accordance with the present invention.

Reflow soldering is a widely used process for attaching surface mount components to pads on a printed circuit board. In the normal reflow soldering process, the terminations or solderable areas on the underneath side of the surface mount component are coated with a thin solderable coating that is particularly well suited for the soldering process. On the top side of the printed circuit board is deposited a large heatsink mounting pad and several smaller pads that are coupled through electrical conductors to other parts of the printed circuit board. Typically, the hint sink pads serve to dissipate heat from the electronic device through the printed circuit board and out to a thermal sink.

The soldering process begins with printing a solder paste through a stencil having apertures that generally match the size and location of the mounting pads on the surface mount device. The surface mount device is then carefully positioned on top of the solder paste, with the solderable areas on the underneath side of a surface mount device maintaining registration with the mounting pads on the top surface of the printed circuit board. The printed circuit board and surface mount device are then passed through a reflow soldering oven for heating the pre-solder coating and solder paste to a liquified state, both mechanically and electrically coupling the surface mount device to the printed circuit board upon solidification of the molten solder.

In many cases, a solder resist is applied, during the circuit board fabrication, to the upper surface of the printed circuit board for protection of the areas for which soldering is not required. The solder resist is removed in the areas surrounding the pads on the printed circuit and in other areas where solder flow and solder paste are required.

As used herein, the printed circuit board material of choice is a glass filled epoxy material such as an FR4 epoxy glass substrate, and the protective solder resist coating comprises a thermally cured wet film resist such as PROBIMER, a trademark product manufactured by Ciba-Geigy Corporation of Terry Town, N.Y. The thermal and electrical conductive pads formed on the top and bottom surfaces of the printed circuit board are made from copper coated with a tin-lead alloy or organic anti-oxidant coating. Solder paste may be product 376EH sold by Alpha Metals of Jersey City, N.J. While this construction is used in the preferred embodiments, one skilled in the art will recognize that other common printed circuit board construction/materials such as FR6 and Polyimide, as well as other solder paste materials may also be used.

The printed circuit board in accordance with the present invention may be fabricated using industry-standard printed circuit board fabrication techniques, such as additive or subtractive methods. One variation of the additive method is described in brief: (1) the base circuit board material is drilled (where plated through holes are desired) and prepared for plating; (2) the base material is plated with a thin copper coating by an electroless plating process; (3) circuit patters are defined using a photolithographic process, in which a photoimageable resist material is applied over the substrate and selectively removed so that areas where circuit conductors desired are exposed; (4) the substrate is electrolytically plated with copper so that circuit conductors attain a desired thickness; (5) the resist material is chemically removed; (6) the substrate is chemically etched to remove the thin copper coating from areas not desired as conductors. If a protective solder resist coating is to be provided, the resist material is applied over the substrate and, using a photolithographic process, is selectively removed from areas of interest, such as component mounting pads.

Next, during printed circuit board assembly, solder paste is applied to component mounting pads. The surface mount devices then are deposited on the appropriate locations on the printed circuit board through the use of an automated pick and place machine. The surface mount device is held in place by the solder paste such that the pads on the underneath side of the surface mount device are exactly aligned with the pads on the printed circuit board.

Finally, the substrate and the surface mount components thereon are passed through a reflow oven in order to liquify the solder paste, thereby wetting the surface mount component solderable areas and the corresponding mounting pads on the printed circuit board. The wetting process allows the solder to flow over the pads, directed through surface tension toward the minimizing of the surface free energy of the liquid solder. During this liquid state the surface mount device may move relatively freely on the mounting pad, and this movement can cause misalignment. In accordance with the present invention, the surface tension of the liquified solder can be utilized to hold proper component alignment and even to pull a misaligned surface mount device into the proper orientation.

PRIOR ART SOLUTIONS

Figure 15:
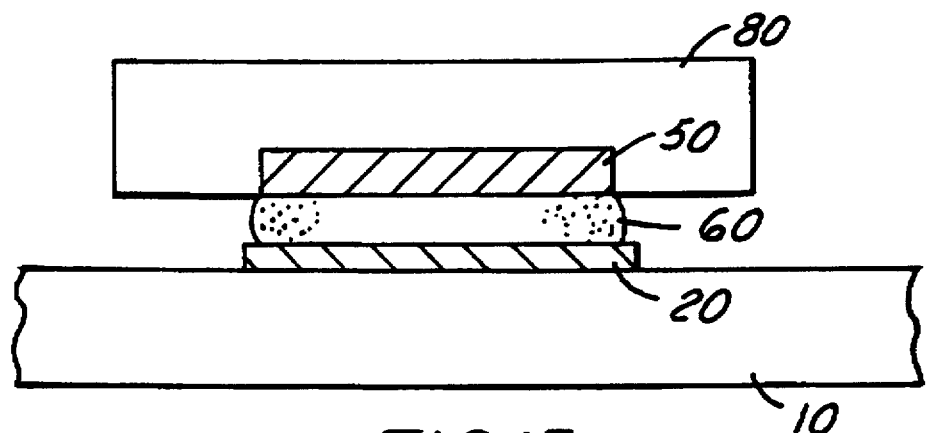
FIG. 15 is a cross section view of the surface mount component taken along section lines C—C in FIG. 10.

FIGS. 1 and 4 illustrate one method of coupling a surface mount device to a printed circuit board. With reference to FIG. 1, reference numeral 12 defines the outline of the opening in the solder resist 11 which is deposited on top of the upper surface of the printed circuit board 10 (not separately illustrated). Reference numeral 20 designates the copper heatsink mounting pad which is photo lithographically produced on the upper surface of the printed circuit board. Reference numerals 30 and 40 designate the first and second lead mounting pads respectively for the DPAK SMD component package. The signal/power leads 32 and 42 are illustrated as being the same shape as but slightly smaller in size than their corresponding lead mounting pads 30 and 40 on the printed circuit board. These reference numerals will be used throughout FIGS. 1, 2, 3, 4, 5 and 6 for consistency. A cross sectioned view of the printed circuit board substrate 10, substrate mounting pad 20, solder paste 60, component heatsink 50 and the electronic component 80 are illustrated in FIG. 15.

In FIG. 1, the size and shape of the heatsink mounting pad 20 are nearly coincident with but slightly smaller than the size and shape of the solder mask opening 12. FIG. 4 corresponds to the same configuration as FIG. 1 except that the footprint of the solderable portion of the heatsink 50 on the surface mount device, such as shown in FIG. 15, is shown as being aligned on the heatsink mounting pad 20.

Note in FIG. 1 that the size and shape of the component heatsink footprint 50 correspond very closely to the shape and dimensions of the heatsink mounting pad 20. This close correspondence tends to limit component displacement during the reflow soldering process due to the surface tension forces, but the relative small size of the heatsink mounting pad 20 severely limits the transmission of the heat energy from the surface mount device through the component heatsink 50 (not actually shown), the heatsink mounting pad 20 and into the printed circuit board. While this configuration may be suitable for low power devices, it is not adequate for proper operation of high power devices that must operate over long periods of time.

Referring now to FIG. 2, the size of the heatsink mounting pad has been enlarged to the size of the rectangle 20. The solder mask opening 12 remains the same as in FIG. 1. In corresponding FIG. 5, the solderable portion of the component heatsink 50 remains the same as in FIG. 4. This configuration is capable of transferring increased heat from the surface mount device, through the component heatsink 50, through the heatsink mounting pad 20, and into the printed circuit board because the area of heatsink mounting pad 20 has been enlarged to significantly improve the heat transfer characteristics into the printed circuit board. However, this configuration requires the additional use of the non-solderable resist material 12 to define the size and shape of the exposed portion of the mounting pad 20. If not used for other purposes, the non-solderable resist material 12 increases the complexity and cost of manufacturing the circuit board.

With reference to FIG. 3, the size of the mounting pad 20 has been increased in the same manner as in FIG. 2, but in this case no use is made of the non-solderable resist material for defining the solder mask opening. Therefore, as illustrated in FIG. 6, any small perturbation forces encountered in the manufacturing process can easily jar the component heatsink 50 out of proper alignment. This misalignment can cause substantial performance problems, as well as open and short circuits when the leads 32 and 42 from the DPAK component package improperly contact the corresponding lead mounting pads 30 and 40.

With specific reference to FIGS. 3 and 10, multiple thermal vias 28 are shown as communicating through the heatsink mounting pad 20 to increase the heat transfer capability from the component heatsink 50 and into and through the printed circuit board. The thermal vias may be present in all embodiments, but are not shown elsewhere for clarity. These thermal vias 28 may be "plugged" with a non-solderable material to inhibit possible defects in subsequent processing. However, these plugged vias 28 sometimes cause gases to be trapped under the solder paste. When the solder is reflowed into the liquid state, these trapped gases expand rapidly and bubbles form under the component heatsink 50. These bubbles expand rapidly and either burst or induce sideways forces that cause the misalignment of the component heatsink 50 substantially as shown in FIG. 6.

DETAILED DESCRIPTION OF THE PREFERRED EMBODIMENT

The enlarged size of the heatsink mounting pad utilized in FIGS. 3 and 6 has been retained in the first preferred embodiment of the present invention as illustrated in FIG. 7, except that the shape has been modified to be an inverted "T" shape. In this preferred embodiment, the surface area of the heatsink mounting pad is substantially larger, that is larger by at least 15% to 200% or more than the surface area of the component heatsink (depending on the thermal conductivity of the substrate and thermal power output of the component) so that the heat generated by the electronic component can be efficiently conducted through the substrate. The inverted "T" shape is defined by two notches 130 and 140. Notch 130 is formed by edges 121 and 122, while notch 140 is formed by edge surfaces 123 and 124. Straight edges 122 and 124, which are parallel, will be referred to hereafter as registration edges. Other edges with curved lines would work in a similar manner with component and pad edges juxtaposed along a portion of their perimeters to create a registration edge. The two lead mounting pads 130 and 140 remain generally unchanged from FIGS. 1, 2 and 3.

With reference to FIG. 8, the solder paste 160 is applied generally adjacent to the notches 130 and 140 of the heatsink pad 120. In this manner, when the component heatsink 150, which continues to have the characteristic "T-shape" as illustrated in FIGS. 4, 5, and 6, is placed over the solder paste area 160, a first registration edge 151 of the heatsink 150 becomes juxtaposed with the adjacent registration edge 124 of the component mounting pad. In a similar manner, another registration edge 152 of the heatsink 150 becomes juxtaposed with the corresponding registration edge 122 of the mounting pad 120.

These two overlapping or notch sections, illustrated generally as A and B in FIG. 9, use the surface tension of the molten solder (during reflow soldering) acting on the juxtaposed registration edges to maintain the proper alignment of the heatsink 150 with the enlarged mounting pad 120 without the use of the non-solderable resist material as previously described. When the elements of FIGS. 8 and 9 are combined, the resulting FIG. 10 shows that the solder paste block 160 is generally co-extensive with the edges 151 and 152 of the component heatsink 150 for purposes of aligning the surface tension of the molten solder within notches A and B. These surface tension forces maintain the proper alignment of the surface mount component with regard to the remainder of the printed circuit board.

In a similar manner, the component leads 132 and 142 are held in close alignment by the surface tension of the solder and the parallel or registration edges of the component lead mounting pads 130 and 140.

Finally, with continuing reference to FIG. 10, the juxtaposition of alignment edge 155 of the component heatsink 150 with a corresponding alignment edge 125 of the heatsink mounting pad 120 utilizes the surface tension forces produced during the reflow soldering process to maintain the alignment of edges 155 and 125 in the same manner as the previously described registration edges. It should be noted that this surface tension force is generally s perpendicular to the surface tension forces produced in notches A and B and, therefore provides further stabilization of the surface mount component.

It should be understood that this stabilization effect is achieved by the surface tension forces of the liquid solder acting upon the juxtaposed and generally parallel registration edges defined within notches A and B, alignment edges 125 and 155, as well as the effective registration edges of the component leads 132 and 142 with mounting pads 130 and 140. Since these notches A and B and edges are relatively small in comparison to the size of the heatsink mounting pad 120, the present invention achieves the stable alignment of the relatively small heatsink of the surface mount device on the much larger mounting pad 120 without the use of the non-solderable resist. By not using the non-solderable resist, the expense of the unnecessary material and processing steps are avoided.

The alignment forces produced by the first preferred embodiment of the present invention are usually sufficient to allow the use of thermal vias 128 in the mounting pad 120 as previously described with reference to FIGS. 3 and 6. However, it is advisable to cover only a portion of the thermal vias 128 with the periphery of the solder paste footprint 160 so that air bubbles will not be trapped within the solder paste near the solder paste periphery and burst, thereby dislocating the surface mount device from its proper orientation on the mounting pad during the soldering process.

Figure 12:
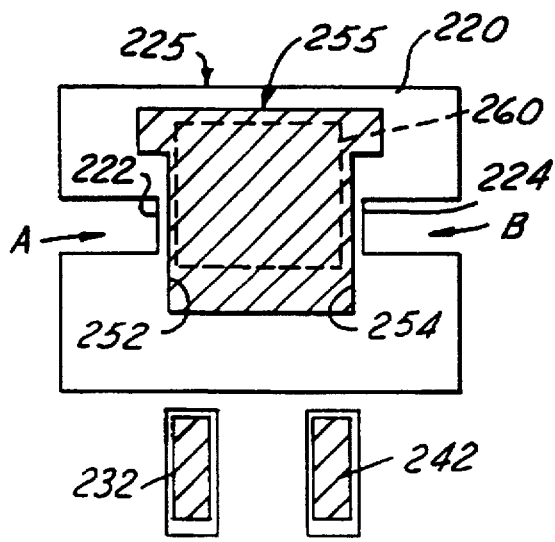

A second preferred embodiment of the present invention is illustrated generally in FIG. 11. This embodiment retains a heatsink mounting pad 220 having the enlarged surface area, but moves the two notches A and B in the mounting pad 220 toward the center portion of the pad. With reference to FIG. 12 wherein solder paste block 260 is shown, notch A assures that registration edge 222 of the mounting pad 220 is juxtaposed with a corresponding registration edge 252 of the heatsink 250 of the surface mount device. Likewise, notch B juxtaposes the registration edge 224 of the mounting pad 220 with a corresponding registration edge 254 of the component heatsink 250. In this manner, the surface tension produced by the melting of the solder paste acting on the juxtaposed registration edges will exert forces that maintain the alignment of the surface mount component on the printed circuit board. Note that the lead mounting pads 230 and 240 remain in alignment with the corresponding component leads 232 and 242 because of their own surface tension forces.

In a similar manner, the juxtaposed corresponding alignment edges 225 of the mounting pad 220 and the corresponding edge 255 of the component heatsink 250 remain in alignment through the use of surface tension forces.

Figure 13:
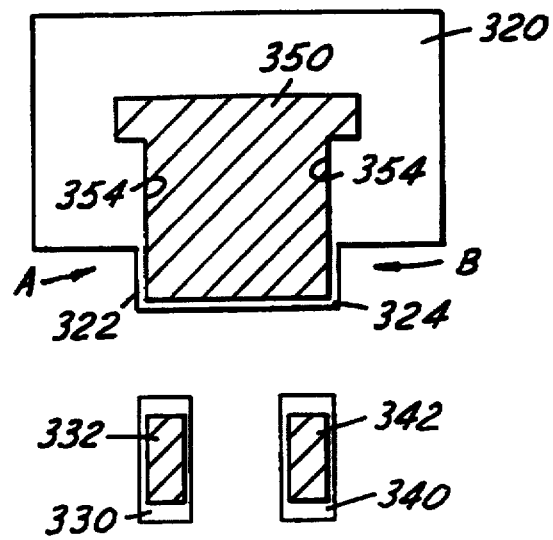
FIGS. 13 and 14 illustrate a second alternate embodiment of the mounting pad and surface mount processes in accordance with the present invention.
Figure 14:
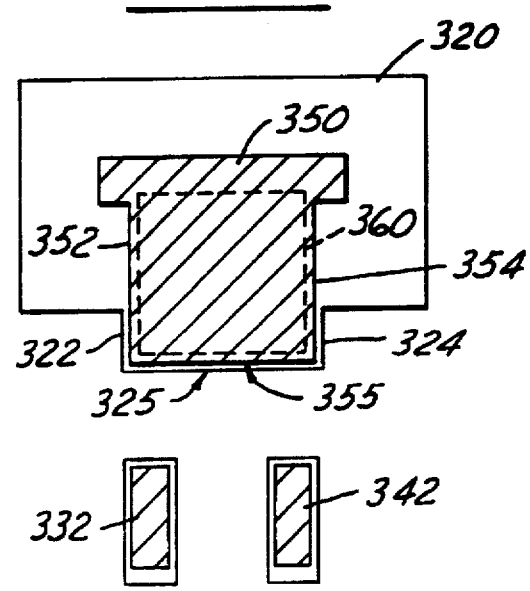

A third preferred embodiment of the present invention is illustrated generally in FIG. 13. This embodiment retains a heatsink mounting pad 320 having the same enlarged surface area, but moves the two notches A and B in the mounting pad 320 toward the lower section of the mounting pad 320. With reference to FIG. 14 wherein solder paste block 360 is shown, notch A assures that registration edge 322 of the mounting pad 320 is juxtaposed with a corresponding registration edge 352 of the heatsink 350 of the surface mount device. Likewise, notch B juxtaposes registration edge 324 of the mounting pad 320 with a corresponding registration edge 354 of the component heatsink 350. In this manner, the surface tension produced by the melting of the soldering paste acting on the juxtaposed registration edges will exert forces that maintain the alignment of the surface mount component in proper alignment on the printed circuit board. Note that the leads 332 and 342 are held in alignment with the corresponding mounting lead mounting pads 330 and 340 from the same surface tension forces.

In a similar manner, the juxtaposed corresponding alignment edges 325 of the mounting pad 320 and the corresponding edge 355 of the component heatsink 350 is held in place through the surface tension of the melted solder.

Figure 16:
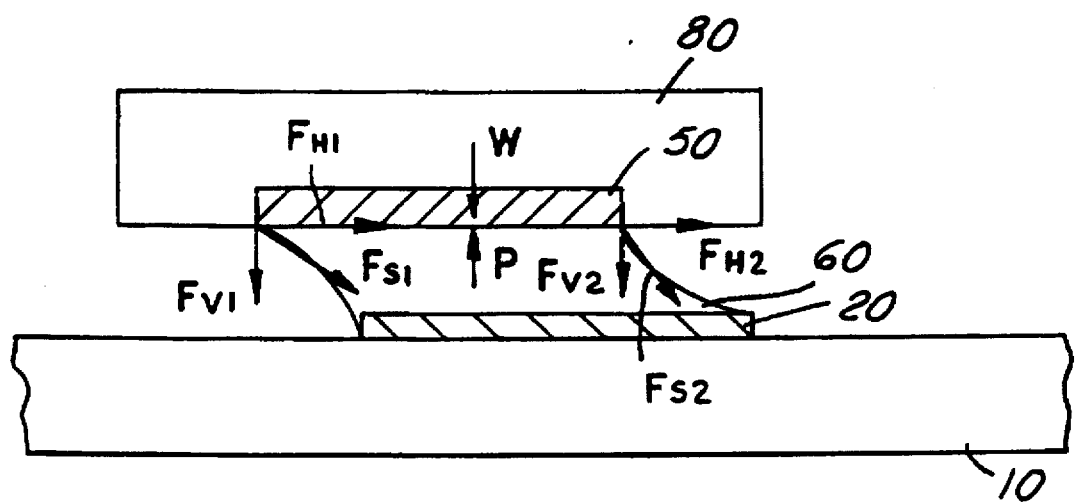
FIG. 16 is a cross section view through the notch region along section lines C—C in FIG. 10 showing the restoring force vectors exerted on the electronic component by the surface tension forces of the molten solder during reflow soldering.
Figure 17:
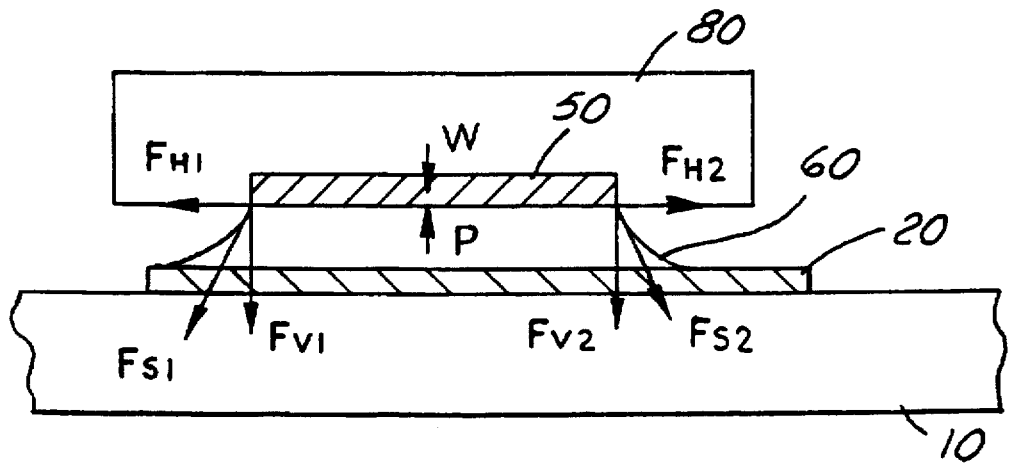
FIG. 17 is a cross section view through an un-notched pad, such as shown in FIG. 6, illustrating the force vectors exerted on the electronic component by the surface tension forces of the molten solder which produce no centering force or restoring moment.

In FIG. 16, which shows a cross sectioned view through the notched region of the substrate 10 and the component heatsink 50, it is apparent that the horizontal components $F_{H1}$ and $F_{H2}$ of the surface tension forces tend to recenter the heatsink 50 and provide an anti-skewing restoring moment. With reference to FIG. 17 in which no notch is present in the substrate pad 20, forces $F_{H1}$ and $F_{H2}$ point in opposite directions and tend to cancel each other and produce no centering force or restoring moment.

The invention has been described in detail with particular reference to an illustrative preferred embodiment and two optional embodiments. However, it will be understood that variations and modifications can be effected within the spirit and scope of the invention as described here and above and as defined in the following claims.

We claim:

1. A footprint for mounting a surface mount component of the type having a heatsink of known area and a defined periphery including a first registration edge, the footprint comprising:

a substrate pad formed on a substrate and positioned for registrated engagement with the heatsink of the electronic component, said substrate pad having an area substantially larger than the area of the heatsink, with said substrate pad including a first notch defining therein a first registration edge for being juxtaposed with the first registration edge on the heatsink when the electronic component is in proper alignment on said substrate pad, whereby the surface tension forces produced by the melting of a conductive paste interposed between the heatsink and said substrate pad act upon said first registration edges to maintain proper alignment of the component with said substrate pad.

2. The footprint as described in claim 1 wherein said substrate pad further includes a second notch defining a second registration edge positioned to be juxtaposed with a corresponding second registration edge on the periphery of the heatsink of the electronic component, whereby the surface tension forces produced by the melting of the conductive paste interposed between the heatsink and said substrate pad acts upon said second registration edges in order to maintain proper alignment of the component with said substrate pad.

3. The footprint as described in claim 2 wherein said first and second notches are on opposing sides of said substrate pad.

4. The footprint as described in claim 2 wherein said first registration edge and said second registration edge on said substrate pad are generally parallel edges.

5. The footprint as described in claim 4 wherein said first registration edge and said second registration edge on said substrate pad are straight edges.

6. The footprint as described in claim 1 wherein said surface area of said substrate pad is at least 15% larger than the known surface area of the heatsink of the surface mount component.

7. The footprint as described in claim 1 further including a plurality of component lead pads located generally adjacent to said substrate pad, with each of said lead pads having at least one registration edge oriented in proper alignment with a corresponding registration edge on a lead of the surface mount component when properly aligned.

8. The footprint as described in claim 7 wherein said registration edge on said component lead pad is generally parallel to said first registration edge on said substrate pad.

9. The footprint as described in claim 7 wherein said component lead pads are separated from said substrate pad in a direction generally perpendicular to a line drawn between the said first and second notches of said substrate pad.

10. A method for aligning and attaching a surface mount component, including a heatsink having a known area and a periphery including at least one registration edge, to a corresponding substrate pad, comprising the steps of:

forming on a substrate the substrate pad with an area substantially larger than the known area of the component heatsink, and with a periphery including at least one notch defining therein a first registration edge corresponding to the one registration edge on the heatsink, applying a conductive material to the substrate pad adjacent the corresponding registration edges, mounting the surface mount component on the conductive material and the substrate oriented such that the one registration edge on the periphery of the heatsink of the component is juxtaposed with its corresponding first registration edge on the substrate pad, and then reflow soldering the conductive material, whereby the conductive material liquifies and the resulting surface tension forces acting on the adjacent registration edges align the heatsink with the substrate pad.

11. The method as described in claim 10 wherein the periphery of the component heatsink further includes another registration edge, including the additional step of:

forming the substrate pad with a periphery including a second notch defining therein a second registration edge, mounting the surface mount component on the conductive material and the substrate oriented such that another registration edge is juxtaposed with its second registration edge on the substrate pad.

12. The method as described in claim 11 further including the step of forming the area of the substrate pad at least 15% larger than the area of the known area of the heatsink of the surface mount component.

13. The method as described in claim 12 further including the step of forming the first and second notches on opposing sides of the periphery of the substrate pad.

14. The method as described in claim 12 further including the step of forming the first and second registration edges generally parallel to but spaced from each other.

15. The method as described in claim 11 further including the step of forming the first and second registration edges as straight lines generally parallel with each other.

16. A footprint for mounting a surface mount component of the type having a heatsink of known area and a defined periphery including first and second registration edges, the footprint comprising:

a substrate pad formed on a substrate and positioned for registrated engagement with the heatsink of the electronic component, said substrate pad having an area substantially larger than the area of the heatsink, with said substrate pad including along a periphery thereof a first notch defining therein a first registration edge and a second notch for defining therein a second registration edge, said first and second registration edges for being juxtaposed with the corresponding first and second registration edges of the heatsink when the electronic component is in proper alignment on said substrate pad, said first and second notches being on opposite sides of the periphery of said substrate pad, and said first and second registration edges on said substrate pad and the heatsink being generally parallel straight lines, whereby the surface tension forces produced by the melting of a solder paste interposed between the heatsink and said substrate pad act upon said first registration edges and upon said second registration edges to maintain proper alignment of the component with said substrate pad.

17. The footprint as described in claim 16 further including a plurality of component lead pads located generally adjacent to said substrate pad, with each of said lead pads having first and second parallel straight registration edges oriented in proper alignment with corresponding registrations on a lead of the surface mount component when properly aligned on the substrate.

18. The footprint as described in claim 17 wherein said component lead pads are separated from said substrate pad in a direction generally perpendicular to the line drawn between and perpendicular to said first and second registration edges of said substrate pad.

19. The footprint as described in claim 1, wherein said first notch is positioned along the first registration edge of the heat sink.

20. The footprint as described in claim 2, wherein said second notch is positioned along the second registration edge of the heat sink.

21. The method as described in claim 10, wherein said forming step further includes the sub-step of positioning said first notch along the first registration edge of the heat sink.

22. The method as described in claim 11, wherein said forming step further includes the sub-step of positioning said second notch along the second registration edge of the heat sink.

23. The footprint as described in claim 16, wherein said first notch is positioned along the first registration edge of the heat sink and said second notch is positioned along the second registration edge of the heat sink.

* * * * *